(12) United States Patent
Le Scouarnec et al.

(10) Patent No.: US 8,719,667 B2
(45) Date of Patent: May 6, 2014

(54) METHOD FOR ADDING REDUNDANCY DATA TO A DISTRIBUTED DATA STORAGE SYSTEM AND CORRESPONDING DEVICE

(75) Inventors: Nicolas Le Scouarnec, Cesson Sevigne (FR); Gilles Straub, Cesson Sevigne Cedex (FR)

(73) Assignee: Thomson Licensing, Issy-les-Moulineaux (FR)

( * ) Notice: Subject to any disclaimer, the term of this patent is extended or adjusted under 35 U.S.C. 154(b) by 363 days.

(21) Appl. No.: 13/135,260

(22) Filed: Jun. 30, 2011

(65) Prior Publication Data
US 2012/0023385 A1 Jan. 26, 2012

(30) Foreign Application Priority Data

Jul. 26, 2010 (EP) ..................................... 10305825

(51) Int. Cl.
*H03M 13/00* (2006.01)
*G11C 29/00* (2006.01)

(52) U.S. Cl.
USPC .......................................... 714/770; 714/763

(58) Field of Classification Search
USPC .......................................... 714/768, 763, 770
See application file for complete search history.

(56) References Cited

U.S. PATENT DOCUMENTS 8,510,625 B1 * 8/2013 Back et al. .................... 714/758

OTHER PUBLICATIONS

Cong Wang; Qian Wang; Kui Ren; Wenjing Lou;, "Ensuring data storage security in Cloud Computing," Quality of Service, 2009. IWQoS. 17th International Workshop on, vol., No., pp. 1-9, Jul. 13-15, 2009.*
John Kubiatowicz, David Bindel, Yan Chen, Steven Czerwinski, Patrick Eaton, Dennis Geels, Ramakrishan Gummadi, Sean Rhea, Hakim Weatherspoon, Westley Weimer, Chris Wells, and Ben Zhao. 2000. OceanStore: an architecture for global-scale persistent storage. SIGPLAN Not. 35, 11 (Nov. 2000), 190-201.*
Hu et al., "Cooperative Recovery of Distributed Storage Systems from Multiple Losses with Network Coding", IEEE Journal on Selected Areas in Communciations, vol. 28, No. 2, Feb. 2010, pp. 268-276.
Rashmi et al., "Explicit Construction of Optimal Exact Regenerating Codes for Distributed Storage", Proceedings IEEE 47th Annual Allerton Conference, Illinois, Sep. 30, 2009, pp. 1243-1249.
Shah et al., "Explicit codes Uniformly Reducing Repair Bandwidth in Distributed Storage", Proceedings , National Cofnerence on Communications, IEEE, Jan. 29, 2010, pp. 1-5.
Dimakis et al., "A Survey on Network Codes for Distributed Storage", Apr. 26, 2010, pp. 1-13.
Shah et al., "A Flexible Class of Regeneating Codes for Distributed Storage", Proceedings IEE International Symposium on Information Theory, ISIT 2010, Jun. 13, 2010, pp. 1943-1947.
EP Search Report dated Oct. 27, 2010.

* cited by examiner

*Primary Examiner* — Cynthia Britt
(74) *Attorney, Agent, or Firm* — Myers Wolin, LLC

(57) ABSTRACT

The invention proposes a method and device for adding redundancy data in a distributed data storage system. Among others, the invention allows to keep impact on network resources low through the use of coordinated regenerating codes according to the invention.

4 Claims, 16 Drawing Sheets

PRIOR ART

PRIOR ART

METHOD FOR ADDING REDUNDANCY DATA TO A DISTRIBUTED DATA STORAGE SYSTEM AND CORRESPONDING DEVICE

This application claims the benefit, under 35 U.S.C. §119 of EP Patent Application 10305825.1, filed 26 Jul. 2010.

1. FIELD OF INVENTION

The present invention relates to the field of distributed data storage. In particular, the present invention relates to a method and device for adding redundant data to a distributed data storage system, which method and device are particularly efficient with regard to the use of resources of the distributed storage network.

2. TECHNICAL BACKGROUND

The quantity of digital information that is stored by digital storage systems, be it scientific data, photos or videos, is ever increasing. With the multitude of digital devices connected in networks such as the Internet, distributed systems for data storage, such as P2P (Peer-to-Peer) networks, and cloud data storage services, are an interesting alternative to centralized data storage, for storage of scientific data, photos, videos, etc. However, one of the most important problems that arise when using distributed data storage system is its reliability, and especially when an unreliable network such as the Internet is used. In an unreliable network, connections to data storage devices are temporarily or permanently lost, for many different reasons, such as device disconnection due to a powering off, entry into standby mode, connection failure, access right denial, or even physical breakdown. Solutions must therefore be found for large-scale deployment of fast and reliable distributed storage systems that uses the unreliable Internet network. According to prior art, the data to store are protected by devices and methods adding redundant data. According to prior art, this redundant data are either created by mere data replication, through storage of simple data copies, or, for increased storage quantity efficiency, in the form of storing the original data in a form that adds redundancy, for example through application of an erasure correcting coding algorithm such as Reed-Solomon. For protecting the distributed data storage against irremediable data loss it is then essential that the quantity of redundant data that exists in a distributed data storage system remains at all times sufficient to cope with an expected loss rate. As failures occur, some redundancy disappears. In particular, if a certain quantity of redundant data is lost, it is regenerated in due time to ensure this redundancy sufficiency, in a self-healing manner. In a first phase the self-healing mechanism monitors the distributed data storage system to detect device failures. In a second phase the system triggers regeneration of lost redundancy data on a set of spare devices. The lost redundancy is regenerated from the remaining redundancy. However, when redundant data is based on erasure correcting codes, regeneration of the redundant data is known as inducing a high repair cost, i.e. resulting in a large communication overhead. It requires downloading and decoding of a whole item of information, such as a file, in order to regenerate the lost redundancy. This high repair cost can however be reduced significantly when redundant data is based on so-called regenerating codes, issued from information theory; regeneration codes allow regeneration of lost redundancy without decoding. However, prior art solutions for regeneration of redundant data in distributed storage systems that are based on regeneration codes can still be optimized with regard to the impact on the network resources needed to regenerate lost redundancy.

3. SUMMARY OF THE INVENTION

In order to optimize the impact on network resources needed to regenerate lost redundant data, the invention proposes a method and device for adding lost redundant data in a distributed data storage system through coordinated regeneration of codes similar to the previously discussed regenerating codes. The method and device according to the invention fill the gap between the two aforementioned prior-art approaches, i.e. redundant data based on erasure correcting codes and redundant data based on regenerating codes, and the method and device of the invention allow devices to coordinate their regeneration of lost redundant data, to leverage simultaneous repairs and to make more efficient use of resources of the distributed storage network than prior art solutions.

These advantages and other advantages not mentioned here, that make the device and method of the invention advantageously well suited for repairing of redundancy in a distributed storage system, will become clear through the detailed description of the invention that follows.

In order to optimize the impact on network resources needed to regenerate lost redundant data, the invention proposes a method of adding redundant data to a distributed data storage system, the distributed data system storing a file of quantity M bits split in k blocks of a first predetermined quantity $\alpha$ bits, the distributed data storage system comprising devices connected to a network, the method comprising a first successive step where, upon decision to add a first predetermined number t of new devices for adding of redundant data, the first predetermined number being equal to at least two, each of the first predetermined number of new devices contacts a set of any existing devices of a second predetermined number d and obtains, from each of the existing devices of the set, a second predetermined quantity $\beta$ bits of first redundant data in form of at least one code word being the result of a computation applied to the first predetermined quantity $\alpha$ bits of redundant data stored by each of the existing devices; and the method comprising a second successive step where each of the new devices obtains, from each other new devices, a third predetermined quantity $\beta'$ bits of second redundant data in form of at least one code word being the result of a computation applied to all the first redundant data retrieved in the first step in form of at least one code word and stores third redundant data of the first predetermined quantity $\alpha$ bits in form of at least one code word being the result of a computation applied to all the first redundant data retrieved in the first step in form of at least one code word and all the second redundancy data in form of at least one code word, the second predetermined quantity $\beta$ bits being different from the third predetermined quantity $\beta'$ bits.

According to a variant embodiment of the invention, the method minimizes network data transmission bandwidth $\gamma$ needed for carrying out a repair such that $\gamma=d\alpha+(t-1)\beta'$. In this case, the method uses MBCR codes; the values of formulas (7), (8) and (9) of this document are used to obtain the minimization.

According to a variant embodiment of the invention, the computations are linear functions.

The invention also concerns a storage device part of a distributed data storage system where data storage devices are connected in a network, the distributed data storage system storing a file of quantity M bits split in k blocks of a first predetermined quantity $\alpha$ bits, the storage device comprising means to contact a set of any existing devices of a second predetermined number d and to obtain, from each of the existing devices of the set, a second predetermined quantity β bits of first redundant data in form of at least one code word being the result of a computation applied to the first predetermined quantity α bits of redundant data stored by each of the existing devices; and means to obtain, from each other new devices, a third predetermined quantity β bits of second redundant data in form of at least one code word being the result of a computation applied to all the first redundant data retrieved in the first step in form of at least one code word and stores third redundant data of the first predetermined quantity α bits in form of at least one code word being the result of a computation applied to all the first redundant data retrieved in the first step in form of at least one code word and all the second redundancy data in form of at least one code word, the second predetermined quantity β bits being different from said third predetermined quantity β' bits.

4. LIST OF FIGURES

More advantages of the invention will appear through the description of particular, non-restricting embodiments of the invention. The embodiments will be described with reference to the following figures.

Figure 4:
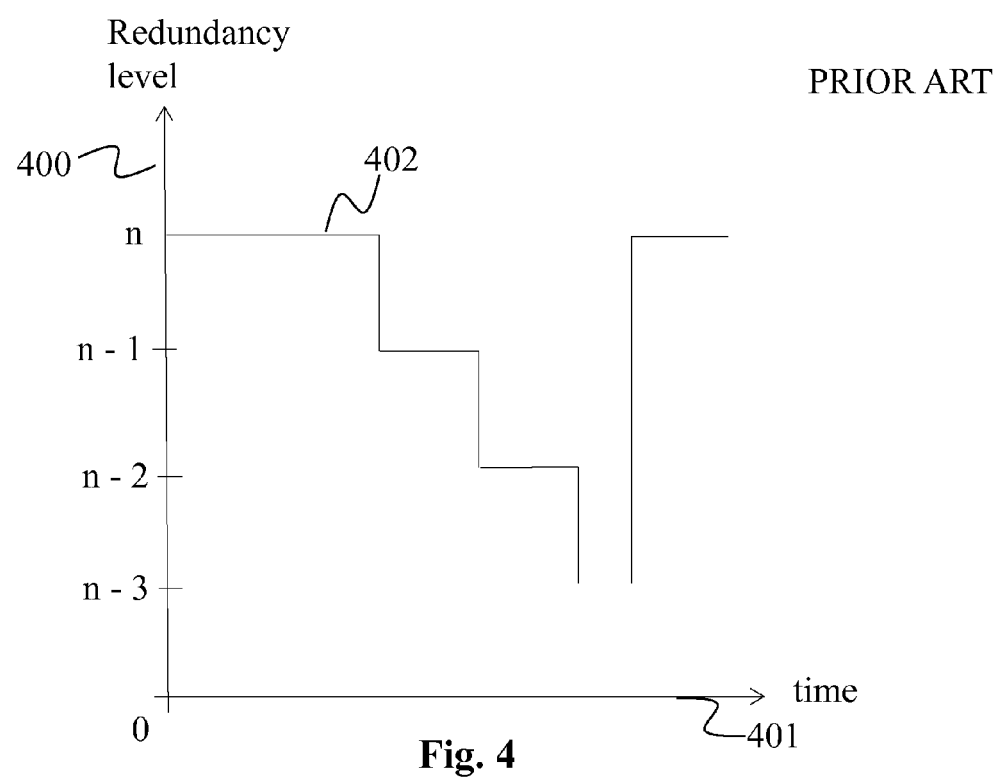
FIG. 4 shows how the efficiency of prior art redundancy level management is enhanced by a prior-art method of delaying and factorizing repairs of lost redundancy data that is based on erasure correcting codes.
Figure 5:
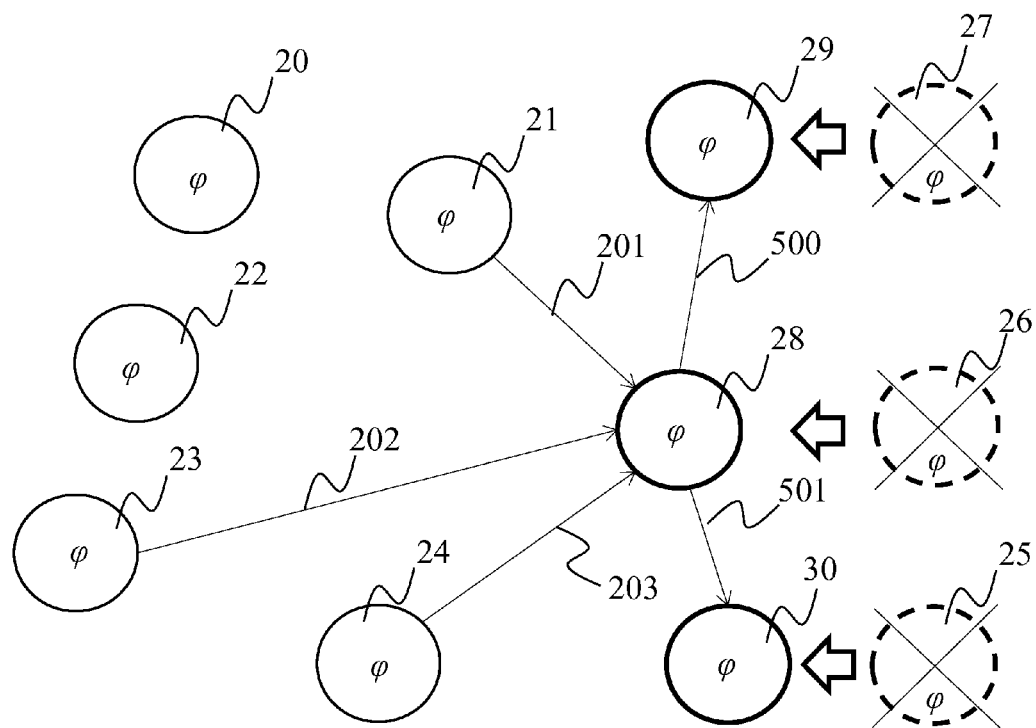

FIG. 5 further illustrates the repair strategy discussed for FIG. 4.

Figure 6:
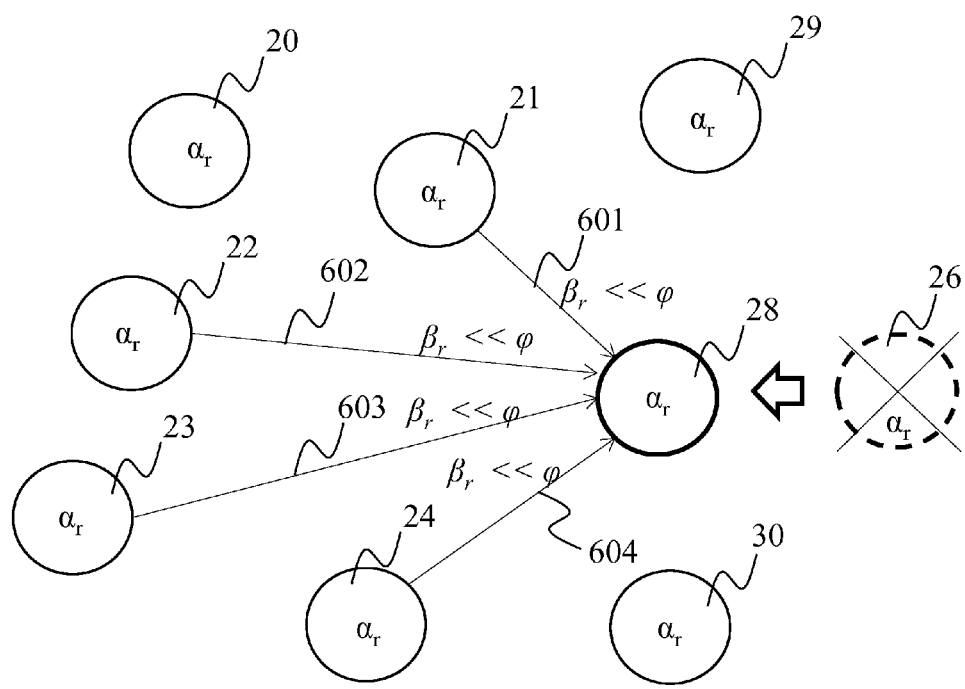

FIG. 6 illustrates another prior-art method of improving the efficiency of prior-art repair of data redundancy through use of a network coding technique.

Figure 7:
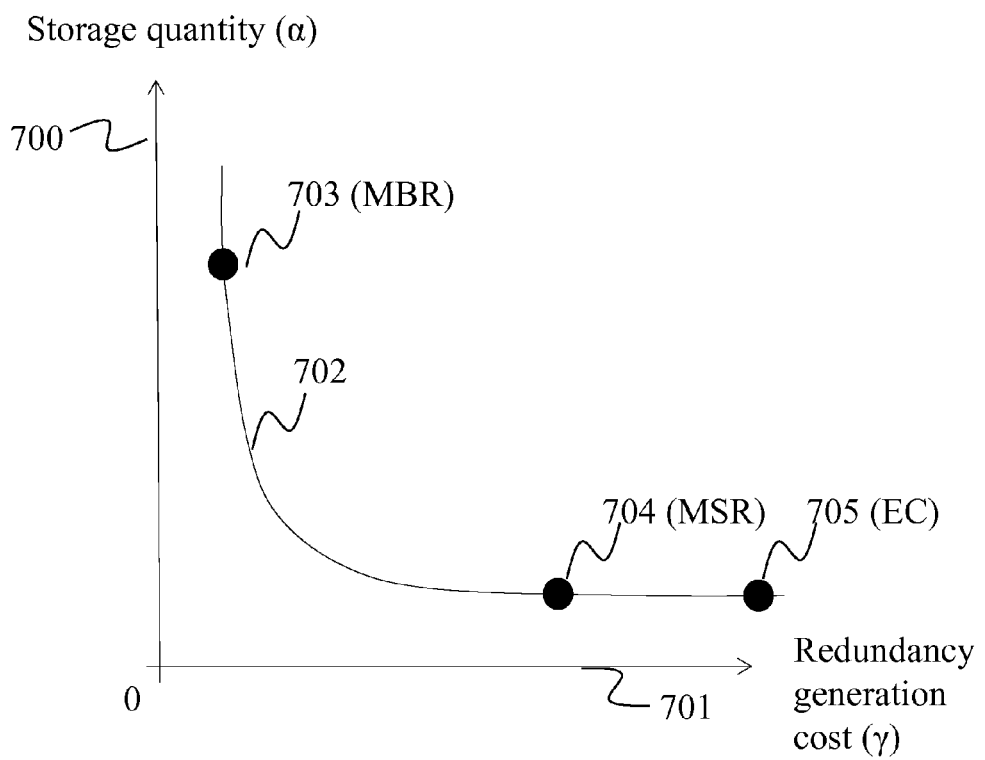

FIG. 7 illustrates known regenerating codes MBR (Minimum Bandwidth Regenerating) 703 and MSR (Minimum Storage Regenerating) 704 that offer improved performances in terms of network bandwidth used for a repair, when compared to the performance of erasure correcting codes 705.

Figure 8:
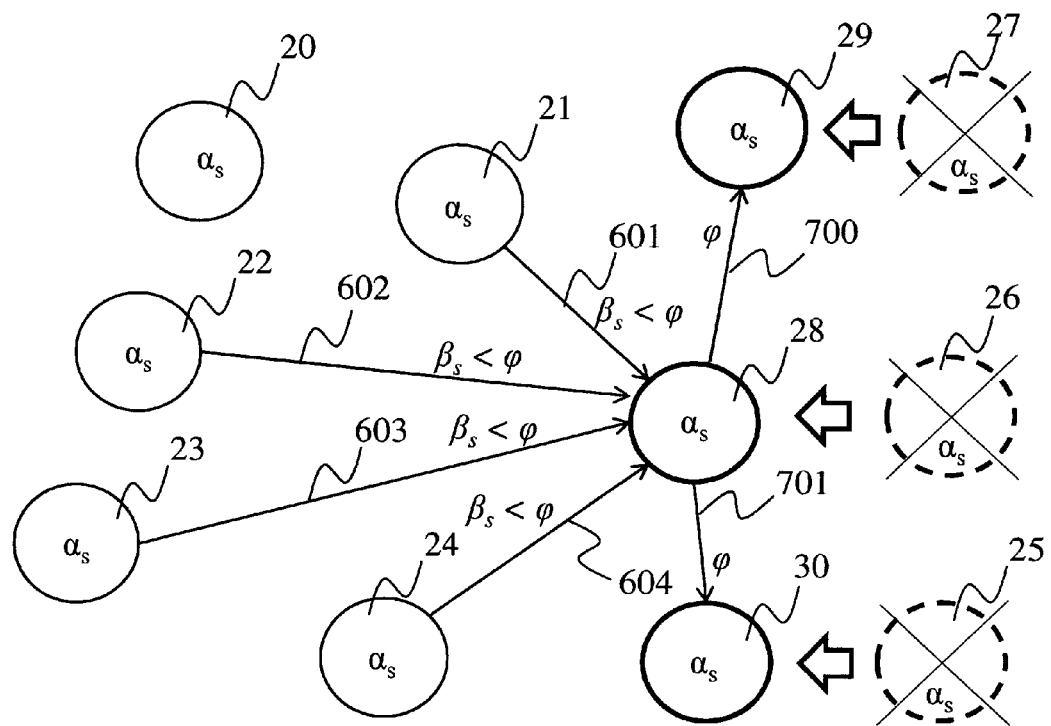

FIG. 8 shows a tentative of adapting the previously discussed method of delaying and factorizing repairs using erasure correcting codes to previously discussed regenerating codes, that is based on a combination of prior art methods.

Figure 9:
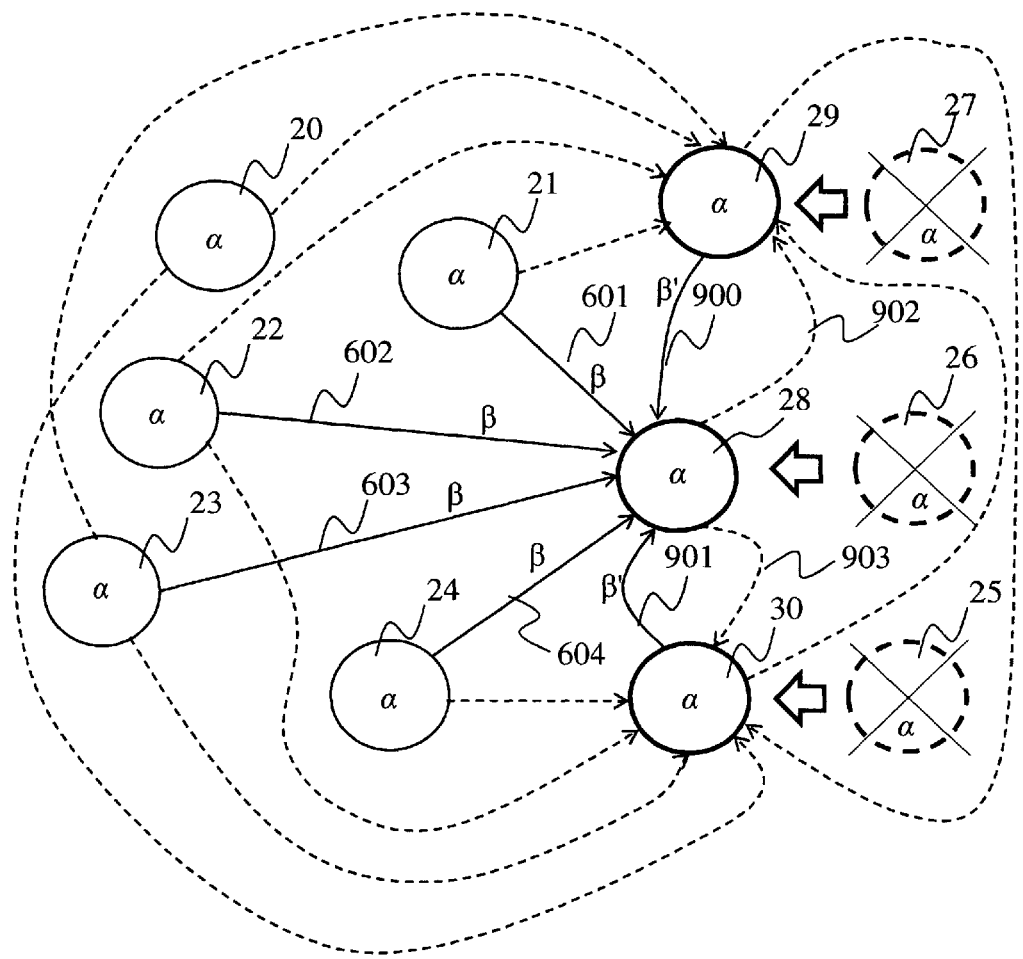

FIG. 9 illustrates a method of repairing lost redundancy data in a distributed data storage system according to a particular embodiment of the invention, which is capable of combining the advantages of using regenerating codes with delayed/factorized repair.

Figure 10:
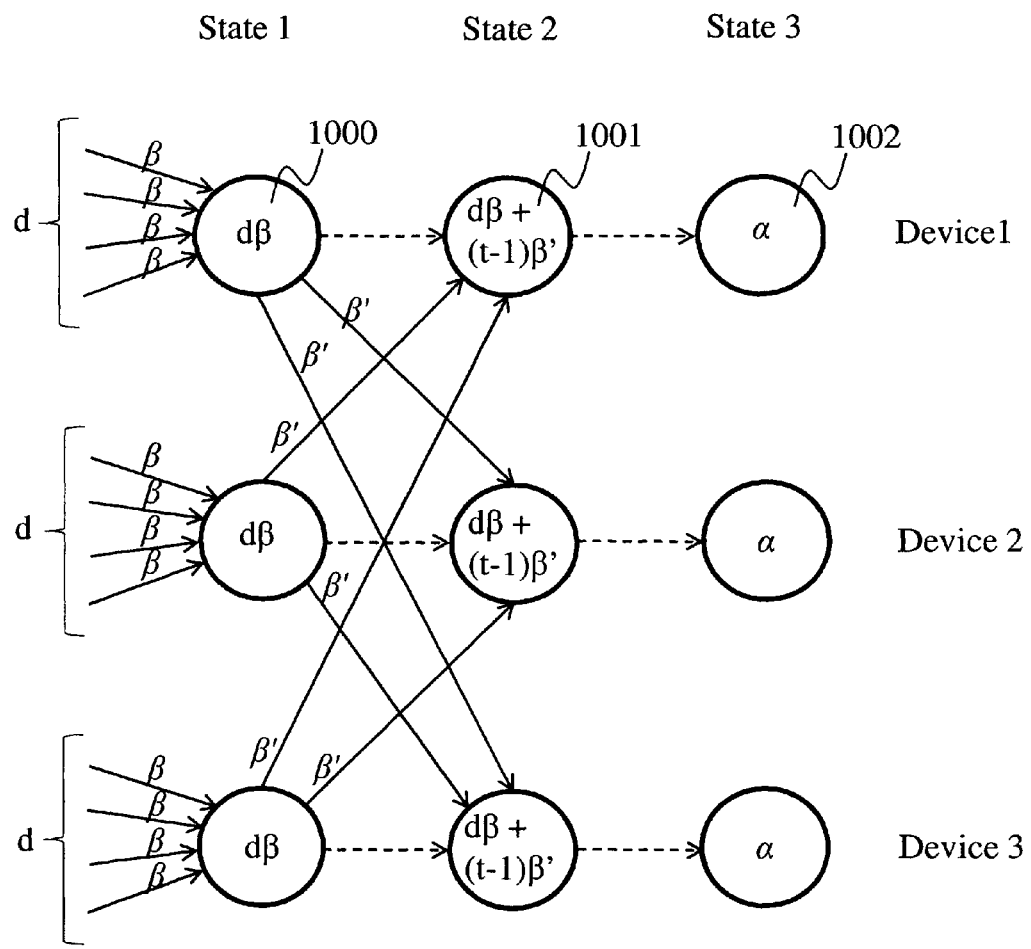

FIG. 10 illustrates the particular embodiment of the invention of FIG. 9 through an information flow graph for t=3 new/replacing devices.

Figure 11:
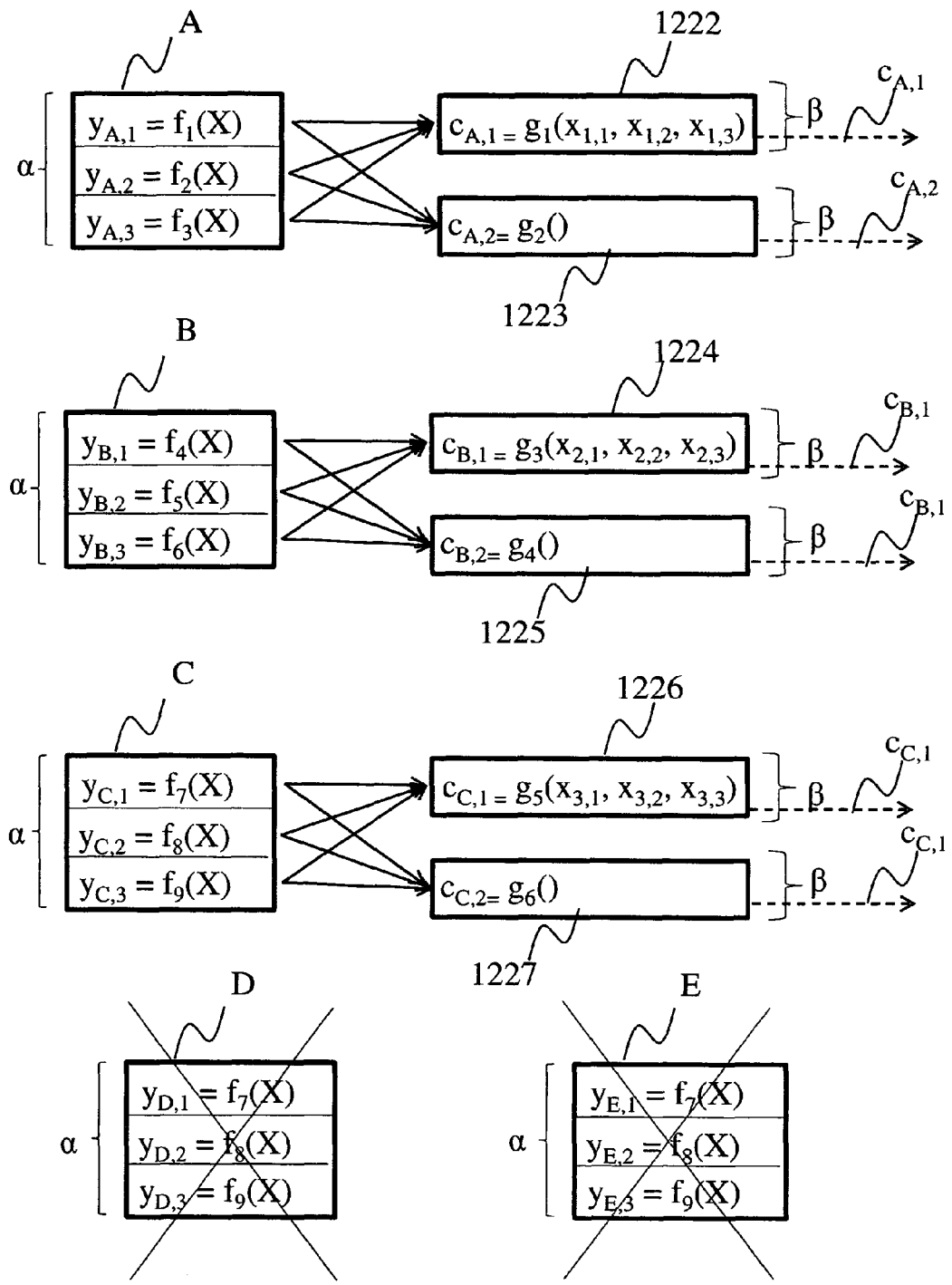
Figure 12:
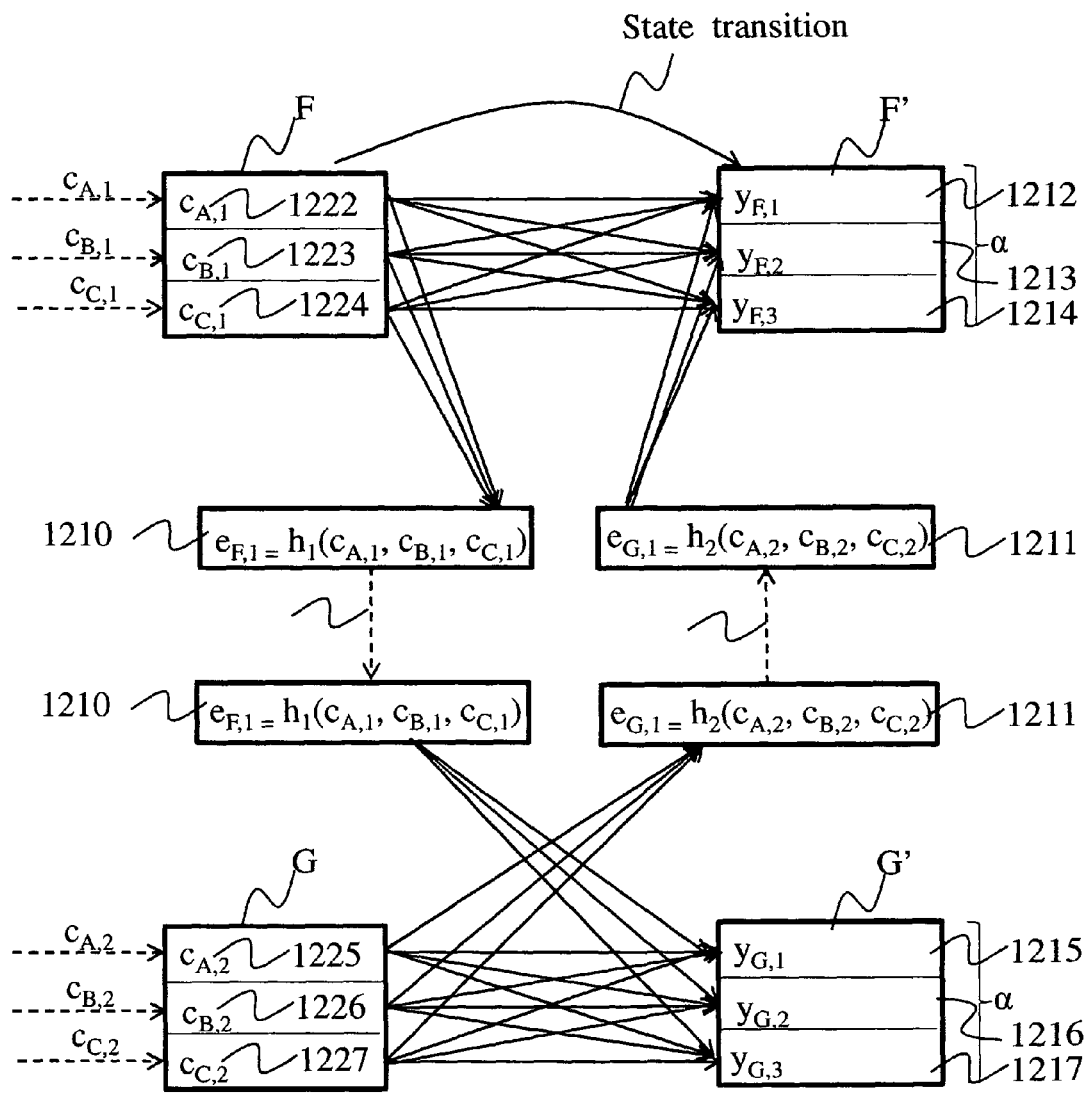

FIGS. 11-12 illustrate the method of the invention using coordinated regenerating codes of the invention based on an implementation with linear coordinated regenerating codes.

Figure 13:
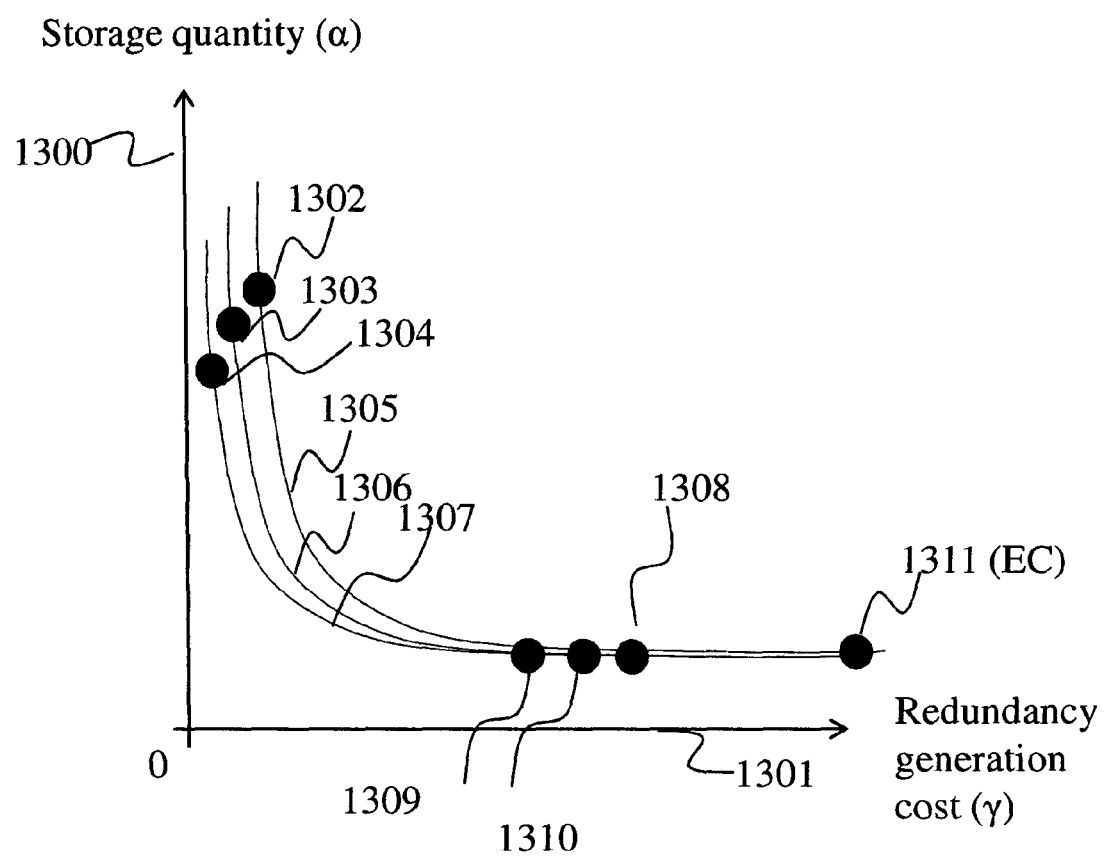

FIG. 13 shows a storage quantity (α) vs repair cost in terms of needed network bandwidth (γ) diagram according to different values of t, the number of devices participating in a delayed/factorized repair.

Figure 14:
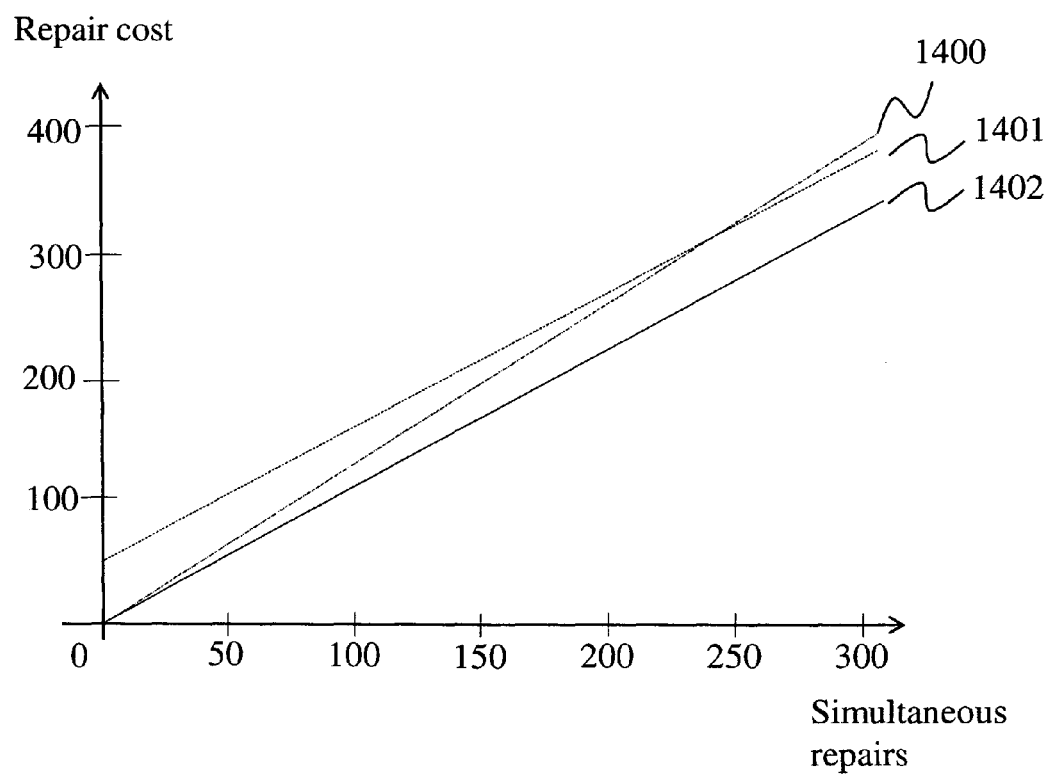

FIG. 14 shows how MSCR codes of the invention outperform both erasure correction codes and MSR regenerating codes.

Figure 15:
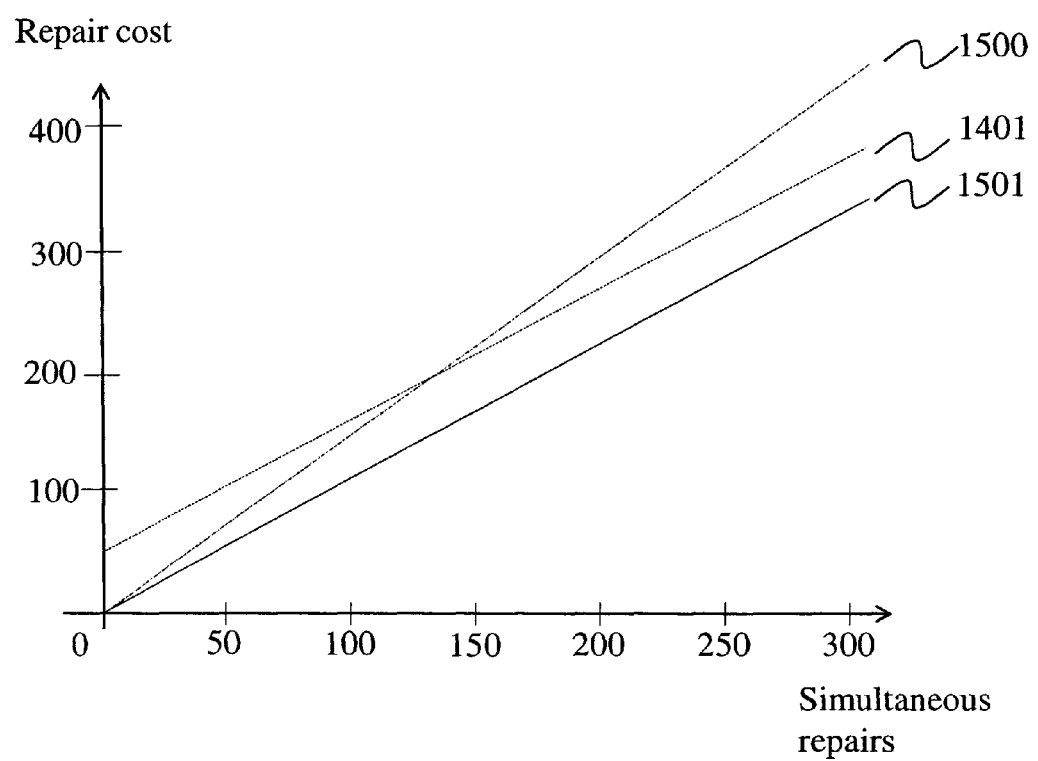

FIG. 15 shows how MBCR codes of the invention outperform both erasure correction codes and MBR regenerating codes.

Figure 16:
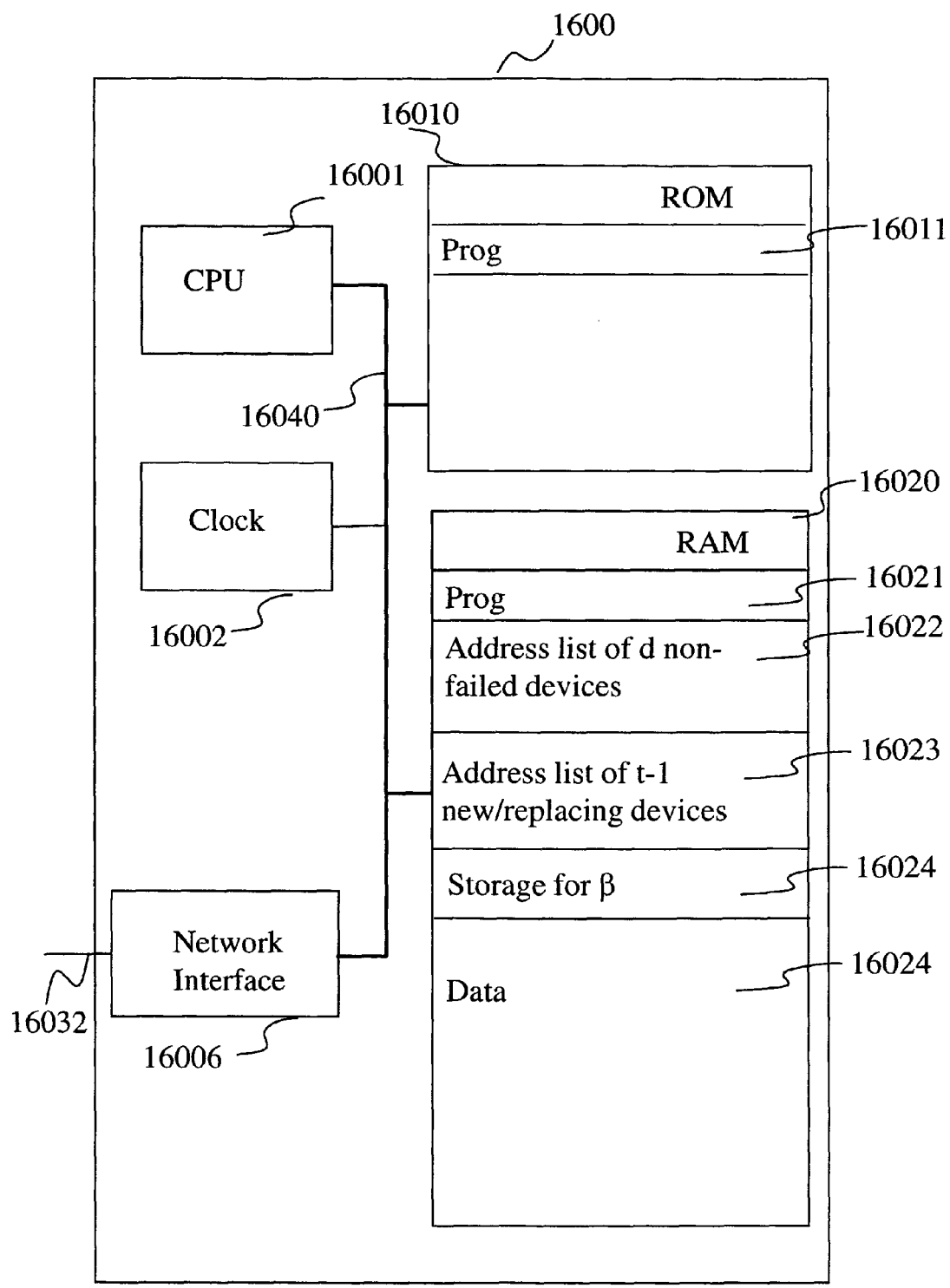

FIG. 16 shows a device 1600 implementing the invention according to a particular embodiment of the invention.

Figure 17:
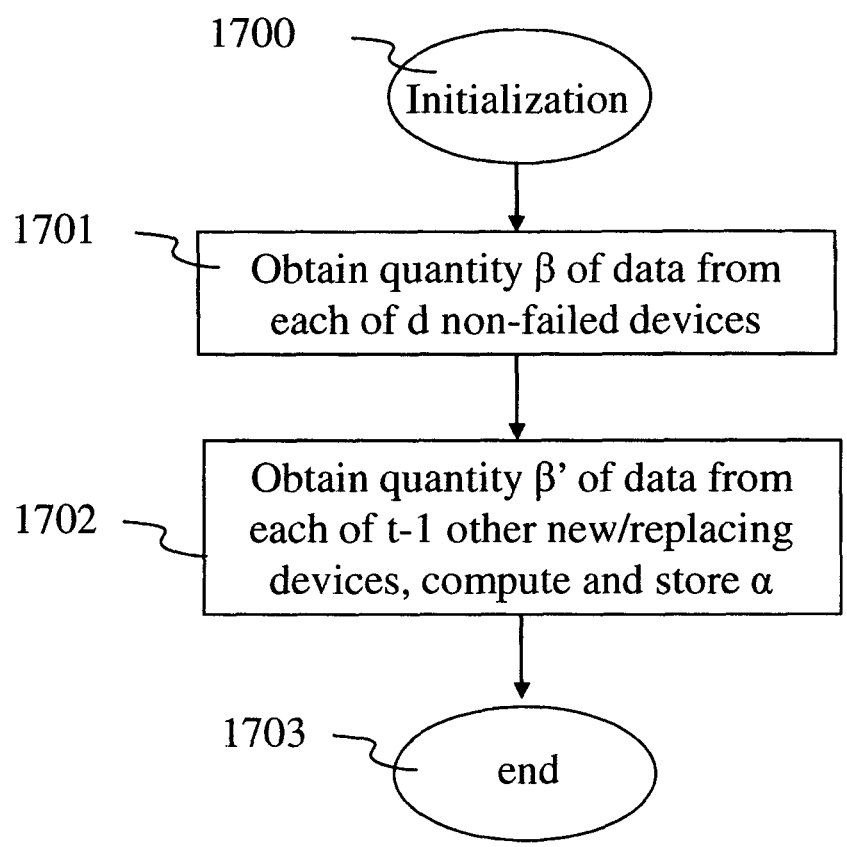

FIG. 17 shows an algorithm of a particular embodiment of the method of the invention.

5. DETAILED DESCRIPTION OF THE INVENTION

Figure 1:
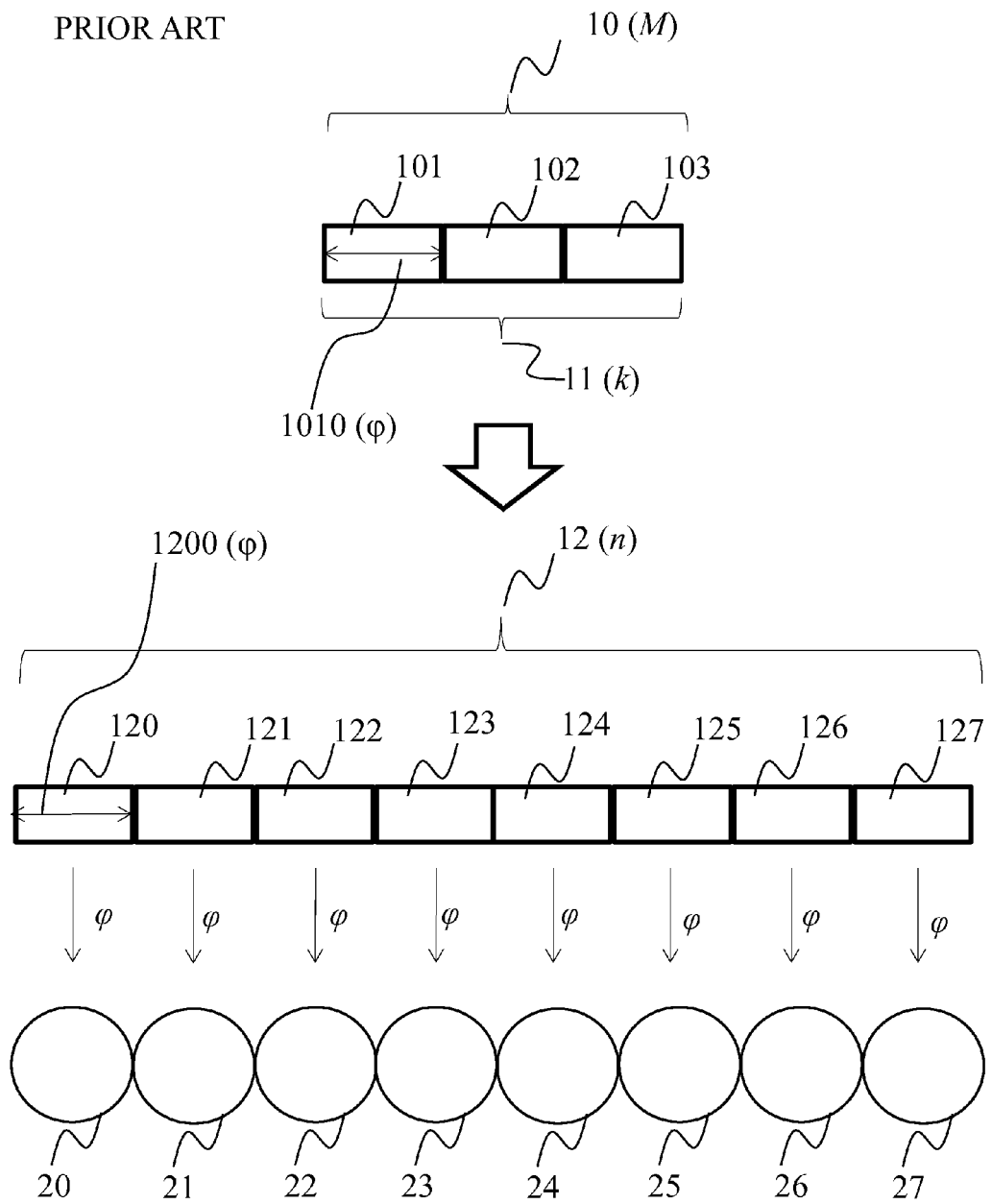
FIG. 1 shows a typical prior-art use of erasure correcting codes to provide error resilience in distributed storage systems.

FIG. 1 shows a typical prior-art use of erasure correcting codes to provide error resilience in distributed storage systems. These erasure correcting codes are for example implemented using well-known Reed-Solomon coding (RS), often referred to as RS(n,k), where n is the number of encoded data blocks, and k is the number of blocks of the original file. An example RS(8,3) data encoding is illustrated for a file 10 of quantity M bits. First, the file is divided into k=3 blocks of quantity φ=M/k, the quantity being illustrated by arrow 1010. After application of an RS(8,3) encoding algorithm 11, the original data is transformed in n=8 different encoded data blocks of the same quantity of each of the original k data blocks, i.e. of quantity φ, the quantity being illustrated by arrow 1200. It is this RS(8,3) encoded data that is stored in the distributed data storage system, represented in the figure by circles 20 to 27 which represent storage nodes or devices of a distributed data system. Each of the different encoded blocks of quantity α is being stored on a different storage device. There is no need to store the original data 101-103, knowing that the original data file can be recreated from any k out of n different encoded blocks. The number n=8 of different encoded data blocks is for example chosen as a function of the maximum number of simultaneous device failures that can be expected in the distributed data storage system, in our example n−k=5.

Figure 2:
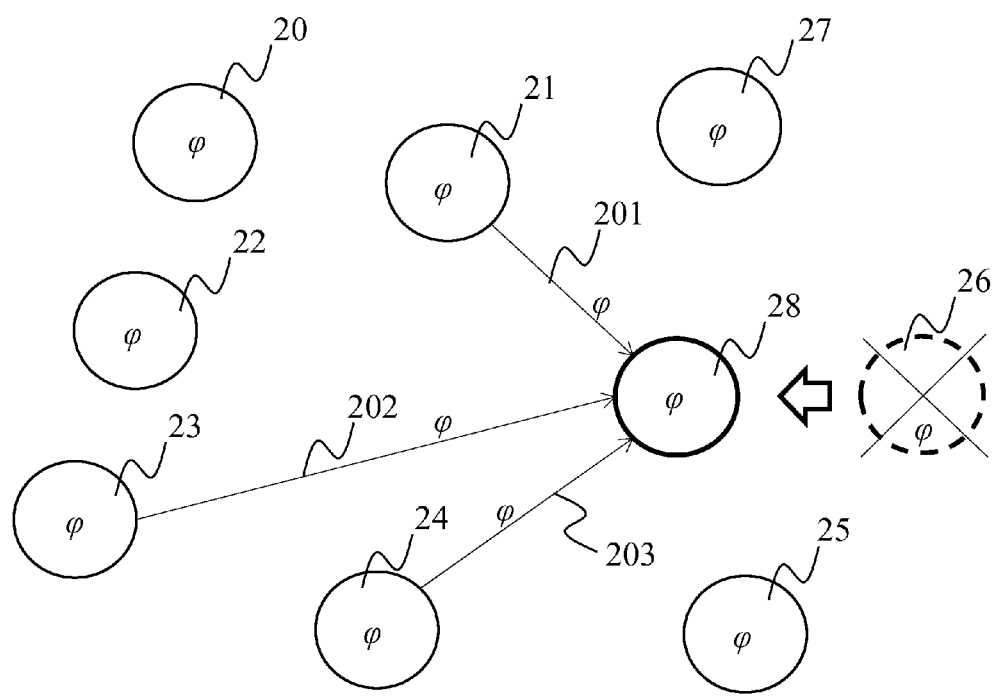
FIG. 2 shows what happens when a storage node or device of the distributed storage system fails.

FIG. 2 shows what happens when a storage node or device of the distributed storage system fails. According to this example, the n=8 devices 20-27 store 8 encoded blocks 120-127, each of quantity φ. When the error resilience management function of the distributed data storage system detects a device failure, here of device 26, a new or spare device 28 is used to recreate the lost redundancy. To do so, the new device 28 is provided with k=3 encoded data blocks of quantity φ from different non-failed devices 21, 23 and 24. The choice of the devices can be deterministic or random, as long as the encoded data blocks that they store are different. Arrows 201, 202 and 203 illustrate how k*φ bits of data are transferred over the distributed data storage network to the new device 28. The new device 28 now recreates the lost encoded data block 126 by decoding of the retrieved encoded data blocks 121, 123 and 124, to recreate the original file 10, and then apply the RS(8,3) algorithm to regenerate the lost encoded data block 126, and store it in the new device 28. The error resilience management function 'knows' which encoded data block is lost, for example by maintaining a table of device identifiers related to encoded block number, and thus knows that when device 26 fails encoded block 126 must be regenerated by the new device 28. As can be seen, the quantities that are transferred to the new device are k*φ, and the new device 28 needs to decode the original file from the encoded blocks and then recode the blocks of the original file to restore the lost encoded block. Thus, though the approach is efficient with respect to data storage quantity, repairing is a relatively expensive operation in terms of usage of resources of the distributed data storage system. Indeed, data of quantity k*φ must be transferred to the new device 28; then the data must be fully decoded to regenerate, through encoding, the lost encoded data. Hence, regenerating redundant data, for example in the form of a single lost encoded data block, implies downloading k encoded data blocks as shown in FIG. 1. In distributed data storage systems, the use of erasure correcting codes is thus somewhat impractical due to the great number of data exchanges that it causes between devices. This is especially true in P2P systems that are often subject to tight bandwidth constraints.

Figure 3:
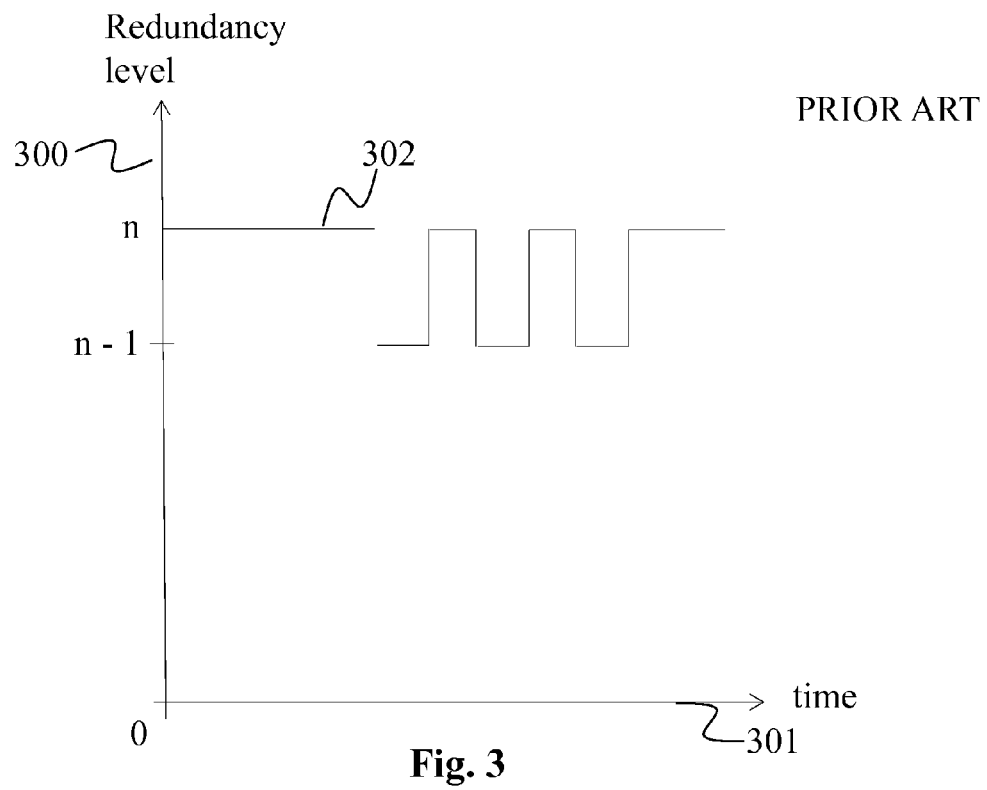
FIG. 3 shows how according to prior art the redundancy level in a distributed data storage network is restored each time the redundancy level decreases from n to n−1.

FIG. 3 shows how according to prior art the redundancy level in a distributed data storage network is restored each time the redundancy level decreases from n to n−1. Redundancy level in the distributed data storage network is depicted on the Y-axis 300. The time is depicted on the X-axis 301.

FIG. 4 shows how the efficiency of prior art redundancy level management is enhanced by a prior-art method of delaying and factorizing repairs of lost redundancy data that is based on erasure correcting codes. The prior art method exploits the fact that 1) the distributed network storage system is set up as to tolerate a number n−k of devices being in a failure state at the same time and 2) when a device has downloaded the k different encoded data blocks, it is capable of encoding any data block for other devices as needed without any additional downloading cost. Therefore, instead of performing a repair each time a single device fails (FIG. 3), a threshold t≤n−k is fixed and repairs are delayed until t devices are in a failed state; the system thus gains in efficiency by reducing the quantity of data transferred to repair t the t devices, since it only downloads only k blocks of quantity φ instead of t*k of quantity φ to repair the t devices.

FIG. 5 further illustrates the repair strategy discussed for FIG. 4. Here, t is chosen to have the value 3. When the t=3 devices fail (25, 26 and 27), one of three new or spare devices 28 downloads k=3 data blocks of quantity φ 121, 123 and 124, regenerates the t=3 lost encoded data blocks 121, 123 and 124 through decoding and encoding, stores one of the encoded blocks and dispatches the two others to the two other (t−1) new or spare devices 29 and 30. This approach reduces the average repair cost in terms of the quantity of data exchanged over the network for a repair by a factor t.

FIG. 6 illustrates another prior-art method of improving the efficiency of prior-art repair of data redundancy through use of a network coding technique. Network coding differs from erasure correcting codes as it allows devices to generate new erasure correcting code blocks with partial knowledge. Network coding based repairs, when compared to the previously discussed method of delaying and factorizing repair, contact more devices (i.e. this method does not allow to take advantage of the factorization of repairs), but download less data from each device during a repair. The repair cost, in terms of quantity of data transferred over the distributed network, is low for each single failure. Network coding uses so-called regenerating codes, that are similar to erasure correcting codes but that differ in the way repairs are performed. These regenerating codes are for example implemented through well-known linear codes, such as random- or deterministic linear network codes. Here, n encoded blocks of quantity $\alpha_r$ bits are computed from the k original data blocks. The number n of different encoded data blocks is for example chosen as a function of the maximum number of simultaneous device failures that can be expected in the distributed data storage system. Each device in the distributed data storage network then stores an encoded block of $\alpha_r$ bits, where $\alpha_r \geq M/k$ bits, M being the quantity of the entire original data item, and k being the number of blocks in which the data item M is divided. Used in a distributed data storage system, regenerating codes differ among others from erasure codes in the way repairs are performed. During a repair, the new device contacts d>k other devices to get $\beta_r \ll \varphi$ (and thus $\beta_r \ll M/k$) bits from each of the d devices, calculates the lost redundancy from the retrieved information and stores it, resulting in the storing of the $\alpha_r$ bits of lost redundancy information as shown. Thus, with the use of regenerating codes, a minimal quantity of information is transferred to the new device to repair one device that stores $\alpha_r$ bits of encoded data.

FIG. 7 illustrates known regenerating codes MBR (Minimum Bandwidth Regenerating) 703 and MSR (Minimum Storage Regenerating) 704 that offer improved performances in terms of network bandwidth used for a repair, when compared to the performance of erasure correcting codes 705. Storage quantity α of encoded data is shown on the Y-axis 700.

FIG. 8 shows a tentative of adapting the previously discussed method of delaying and factorizing repairs using erasure correcting codes to previously discussed regenerating codes, that is based on a combination of prior art methods; notably, using 1) regenerating codes and 2) delaying/factorizing repair. However, the use of regenerating codes implies that if a new device is to be able to repair other devices, the quantity of data that it needs to obtain from the not-failed devices needs to be superior to the quantity of data that is needed for non-delayed/factorized repair. In addition, the repaired device then needs to transmits the whole of its regenerated data to each of the other devices that need to be repaired also. There is thus no gain through delaying/factorizing repairs in the quantity of the data transmitted between devices of the network for the repair action as compared to previously discussed repair methods. FIG. 8 illustrates new device 28 obtaining information of quantity $\beta_s < \varphi$ from each of d>k non failed devices 21, 22, 23 and 24 and new devices 29, 30 each obtaining information of quantity φ from new device 28 to repair the lost data of devices 27 and 25. In the distributed data system of FIG. 8, the dispatch cost is relatively high and exhausts gains obtained from delaying/factorizing repairs.

FIG. 9 illustrates a method of repairing lost redundancy data in a distributed data storage system according to a particular embodiment of the invention, which is capable of combining the advantages of using coordinated regenerating codes of the invention with delayed/factorized repair. The figure shows how information is exchanged between devices when a repair is triggered and the quantities of information that are exchanged. For reasons of readability of the figure, the exchanges for device 28 are drawn with solid lines and the exchanges for devices 29 and 30 are drawn with dotted lines. Using the coordinated regenerating codes according to the invention, a new device, in order to maintain the level of data redundancy in the distributed storage system that drops when a device has failed, is fed with a quantity of data β from d>k devices plus with a quantity β' from t−1 devices. In a first step, when a number of t devices are in a failed state, t being chosen such that t<n−k, a repair action is done. According to the example of FIG. 9, t=3 devices have failed. Each of the new or replacing devices 28, 29 and 30 then contact any of d devices, d being chosen as having the value 4, and obtains a quantity β of data from each of the d devices, where β≪α. In a second step of coordination between new/replacing devices, each of the t new/replacing devices 28, 29 and 30 obtains a quantity β' of data from the t−1 other new/replacing devices, this data being the result of a computation applied to the data retrieved from the non-failed devices in the first step. Finally, each of the new/replacement devices stores data of a quantity α, the data being stored being the result of a computation applied to the data retrieved from the non-failed devices in the first step and the data retrieved from the t−1 new/replacing devices in the second step.

FIG. 10 illustrates the particular embodiment of the invention of FIG. 9 through an information flow graph for t=3 new/replacing devices. The graph is divided in columns and rows; the rows represent devices, for example devices 28, 29 and 30, and the columns represent the states of the devices. The solid line arrows represent communications between the devices, whereas the dotted lines represent state transitions. The quantities of data transferred during each communication are indicated beside each communication arrow. The quantity of data held by each device in each state is indicated inside each circle representing a device state. In state 1, each new/replacing device obtains a quantity β of data from d non-failed devices, thus having a quantity dβ of data. In state 2, each new/replacing device obtains a quantity β' of data from each of the other new/replacing devices, thus having then a quantity of dβ+(t−1)13' of data. In state 3, each new/replacing device stores a quantity α of data. The data of quantity α is the result of a computation applied to the data retrieved by the device from the d non-failed devices (of quantity dβ). The data of quantity α is the result of a computation applied to the data retrieved by the device from the d non-failed devices (of quantity dβ) plus the data retrieved from the other new/replacing devices (of quantity (t−1)β').

The quantities α, β, and β' are determined as follows. These quantities are chosen as a tradeoff between α, the storage quantity, and γ, the bandwidth cost (the bandwidth needed for transferring information between devices in the network) according to variant embodiments of the invention. According to a particular variant embodiment of the invention, the predetermined number of devices t and d and the quantities α, β, and β' satisfy constraints (1) and (2) hereunder, to avoid data loss in the distributed data storage system:

$$\sum_{i=0}^{\frac{k}{t}-1} t\min\{(d-it)\beta, \alpha\} \geq M \quad (1)$$

$$\sum_{i=0}^{k-1} \min\{(d-i)\beta + (t-1)\beta', \alpha\} \geq M \quad (2)$$

The repair cost γ can be expressed as

γ=dβ+(t−1)β'

FIGS. 11-12 illustrate the method of the invention using coordinated regenerating codes of the invention based on an implementation with linear coordinated regenerating codes. The figure illustrates a repair of redundancy in case of two failed devices. The dotted arrows illustrate transmission of data over the distributed data network. Three non-failed devices A, B, C and two new/replacing devices F, G participate in the repair action to restore redundancy data lost through the failure of two devices D, E. F and F' represent state transitions of device F, G, and G' represent state transitions of device G. The data detained by each of the devices A, B, C is expressed as y=f(X), y being a code word that is stored, that has been obtained by application of a linear function f(X) on original data. For each of the devices A-E, the total quantity of data stored is α.

In a first step of the method of the invention, each of the new/replacing devices F, G contacts a set of existing devices A, B and C, and obtains from each of the devices A, B, and C a quantity β of first redundancy data in form of at least one code word (code words $C_{A,1}$ 1222, $C_{B,1}$ 1223, and $C_{C,1}$ 1224 for device F, code words $C_{A,2}$ 1225, $C_{B,2}$ 1226, $C_{C,2}$ 1227 for device G) being the result of a computation applied to the quantity α of data that is stored by each of the non-failed devices A, B and C ($y_{A,1}, y_{A,2}, y_{A,3}$ for device A, $y_{B,1}, y_{B,2}, y_{B,3}$ for device B, $y_{C,1}, y_{C,2}, y_{C,3}$ for device C). For example for device A: the quantity α of data that is stored by device A: α=|$y_1$|+|$y_2$|+|$y_3$| (where |$y_x$| is a quantity of data $y_x$); the code word obtained is $c_{A,1}$, where $c_{A,1}=g_1(x_{A,1},x_{A,2},x_{A,3})$, $g_1$ being a linear function; $c_{A,1}$ is of quantity β.

In a second step, each of the new/replacing devices F, G obtains from each other of the new devices F, G a quantity β' (β'=number of code words*size of the code words) of second redundant data in form of at least one code word 1210 ($E_{F,1}=h_1(C_{A,1}, C_{B,1}, C_{C,1})$), 1211 ($E_{G,1}=h_1(C_{A,2}, C_{B,2}, C_{C,2})$), the at least one code word being the result of a computation applied to all of the redundant data retrieved in the first step in the form of at least one code word (code words $C_{A,1}$ 1222, $C_{B,1}$ 1223, and $C_{C,1}$ 1224 for device F, code words $C_{A,2}$ 1225, $C_{B,2}$ 1226, $C_{C,2}$ 1227 for device G) and each of the new/replacing devices stores third redundant data of quantity α in form of at least one code word ($Y_{F,1}, Y_{F,2}$ and $Y_{F,3}$ for device F, $Y_{G,1}, Y_{G,2}, Y_{G,3}$ for device G) being the result of a computation applied to all first redundant data retrieved in the first step in form of at least one code word (code words $C_{A,1}$ 1222, $C_{B,1}$ 1223, and $C_{C,1}$ 1224 for device F, code words $C_{A,2}$ 1225, $C_{B,2}$ 1226, $C_{C,2}$ 1227 for device G) and all the second redundancy data in form of at least one code word (1210 ($E_{F,1}=h_1(C_{A,1}, C_{B,1}, C_{C,1})$), 1211 ($E_{G,1}=h_2(C_{A,2}, C_{B,2}, C_{C,2})$)). In their simplest form, the functions f, $g_1$, $h_1$, $h_2$ are random linear functions f1(x,y)=ax+by where a and b are randomly chosen.

FIG. 13 shows a storage quantity (α) vs repair cost in terms of needed network bandwidth (γ) diagram according to different values of t, the number of devices participating in a delayed/factorized repair. For t=1 (curve 1305), i.e. no delayed/factorized repair, the method of the invention gives no gain in storage quantity or in needed network bandwidth when compared to prior-art method that uses regenerating codes. For values of t>1 however (curves 1306, 1307), the method of the invention, using coordinated regenerating codes of the invention and delayed/factorized repair, allows gains in both storage quantity and needed network bandwidth. This gain increases as the number of devices participating in a delayed/factorized repair, t, increases, as is shown in curves 1306 and 1307. Points 1302, 1303 and 1304, respectively 1308, 1309 and 1310 indicate optimum tradeoff points for each value of t with regard to storage quantity, respectively with regard to needed network bandwidth. Point 1311 indicates the performance of common error correction codes expressed as a function of (α,γ). Points 1302, 1303 and 1304 are hereinafter referred to as MSCR codes, for Minimum Storage Coordinated Regenerating codes, whereas Points 1308, 1309 and 1310 are hereinafter referred to as MBCR codes, for Minimum Bandwidth Coordinated Regenerating codes. Values for α, β, and β' are determined for MSCR codes according to equations (4), (5) and (6), whereas they are determined for MBCR codes according to equations (7), (8) and (9) hereunder:

$$\alpha = \frac{M}{k} \quad (4)$$

$$\beta = \frac{M}{k}\frac{1}{d-k+t} \quad (5)$$

-continued $$\beta' = \frac{M}{k}\frac{1}{d-k+t} \quad (6)$$

$$\alpha = \frac{M}{k}\frac{2d+t-1}{2d-k+t} \quad (7)$$

$$\beta = \frac{M}{k}\frac{2}{2d-k+t} \quad (8)$$

$$\beta' = \frac{M}{k}\frac{1}{2d-k+t} \quad (9)$$

According to a variant embodiment of the invention, the quantities of redundant data α, β and β' data minimize the quantity α and a total network data transmission bandwidth γ needed for adding redundant data to said distributed data storage system, where γ=dβ+(t−1)β'.

According to a variant embodiment of the invention that uses MSCR codes, the quantity α is minimized, and equations (4), (5) and (6) apply, while the repair cost is expressed as γ=dβ+(t−1)β'. This variant embodiment is particularly useful when storage quantity is to be minimized, for example in a distributed data storage system where only minimal quantities must be stored because the storage devices have relatively small storage size that can be dedicated for the distributed storage.

According to a variant embodiment of the invention that uses MBCR codes, the total network data transmission bandwidth needed for adding redundant data to said distributed data storage system is minimized, such that equations (7), (8) and (9) apply, while the repair cost is expressed as γ=dβ+(t−1)β'. This variant embodiment is particularly useful in a distributed storage system where the bandwidth needed for the adding of redundant data needs to be kept as low as possible in order not to occupy bandwidth space that is needed for other purposes, such as streaming of videos in a Set Top Box environment.

FIG. 14 shows how MSCR codes of the invention outperform both erasure correction codes and MSR regenerating codes. The figure illustrates total repair cost (in terms of total network bandwidth needed in Mbit/s) for d=150 and k=50. Curve 1400 illustrates the performance of prior-art MSR codes. Curve 1401 illustrates the performance of prior-art EC (error correction) codes. Curve 1402 illustrates the performance of MSCR codes according to the invention.

FIG. 15 shows how MBCR codes of the invention outperform both erasure correction codes and MBR regenerating codes. The figure illustrates total repair cost (in terms of total network bandwidth needed in Mbit/s) for d=150 and k=50. Curve 1500 illustrates the performance of prior-art MBR codes. Curve 1401 illustrates the performance of prior-art EC (error correction) codes (this curve is repeated from the previous figure). Curve 1501 illustrates the performance of MBCR codes according to the invention.

The method of the invention permanently outperforms prior art solutions. The two graphs MSCR and MBCR show that the method permanently outperforms the discussed prior art methods. With the help of information theory and information flow graphs, it can be proven that the quantity γ of data is sufficient to restore lost redundancy in a distributed data network according to the invention. For MSCR codes, the best prior art alternatives are regenerating codes for low values of t and erasure codes with delayed repairs for a high value of t. The repair cost in terms of amount of data exchanged over the distributed data network for a repair of redundancy of the first respectively the second prior art solutions are $\gamma_r$=td/(d−k+1)M/k, respectively $\gamma_e$=M/k+(t−1)M/k. A similar reasoning can be applied to MBCR. For any value of t, $\gamma<\gamma_r$ and $\gamma<\gamma_e$, γ being the repair cost with the method of the invention, $\gamma_r$ and $\gamma_e$ being the repair cost with prior art method based on regenerating codes, respectively based on erasure codes.

FIG. 16 shows a device 1600 implementing the invention according to a particular embodiment of the invention. The device comprises the following components, interconnected by a digital data- and address bus 16040:
- a processing unit 16001 (or CPU for Central Processing Unit);
- a non-volatile memory of type ROM (Read Only Memory) 16010;
- a volatile memory of type RAM (Random Access Memory) 16020;
- a clock 16002, providing a reference clock signal for synchronization of operations between the components of the device 1600 and for timing purposes;
- a network interface 16006, for connection of device 1600 to a network.

It is noted that the word "register" used in the description of memories 16010 and 16020 designates in each of the mentioned memories, a low-capacity memory zone capable of storing some binary data, as well as a high-capacity memory zone, capable of storing an executable program, or a whole data set, such as a complete address list of t−1 other new/replacing devices.

Processing unit 16001 can be implemented as a microprocessor, a custom chip, a dedicated (micro-) controller, and so on. ROM memory 16010 can be implemented in any form of non-volatile memory, such as a hard disk, non-volatile random-access memory, EPROM (Erasable Programmable ROM), and so on.

The ROM memory 16010 comprises notably a register 16011 that holds a program representing an executable program comprising the method of adding redundant data to a distributed data storage system of the invention. When powered up, the processing unit 16001 loads the instructions comprised in ROM register 16011, copies them to RAM register 16021, and executes them.

The RAM memory 16020 comprises notably:
- a register 16021 comprising a copy of the program 'prog' of ROM register 16011;
- a register 16022 comprising an address list of d non-failed devices;
- a register 16023 comprising an address list of t−1 new/replacing devices;
- a register 16024 for storing of a quantity β of redundant data;
- a data storage 16025 for storage of temporary results of calculation.

According to a variant embodiment of the invention, the address list 16022 of d non-failed devices and/or the address list 16023 of t−1 other new/replacing devices, is communicated to the device 1100, for example by an error resilience management server. According to a variant embodiment of the invention, the device implementing the invention is a Personal Computer. According to yet another variant embodiment of the invention, the device implementing the invention is a digital television Set Top Box.

FIG. 17 shows an algorithm of a particular embodiment of the method of the invention. The method is for example implemented by the device of FIG. 16. The algorithm starts with an initialization phase 1700, in which variables and attributes needed for the execution of the algorithm are initialized.

In a step 1701, each of the new/replacing devices, for example F, G of FIGS. 11-12 contacts a set of existing devices, for example A, B and C of FIGS. 11-12, and obtains from each of these devices A, B, and C a quantity 13 of first redundancy data in form of at least one code word, for example code words $C_{A,1}$ 1222, $C_{B,1}$ 1223, and $C_{C,1}$ 1224 for device F of FIGS. 11-12, code words $C_{A,2}$ 1225, $C_{B,2}$ 1226, $C_{C,2}$ 1227 for device G of FIGS. 11-12, the first redundancy data being the result of a computation applied to the quantity α of data that is stored by each of the non-failed devices A, B and C (for example $y_{A,1}$, $y_{A,2}$, $y_{A,3}$ for device A of FIGS. 11-12, $y_{B,1}$, $y_{B,2}$, $y_{B,3}$ for device B of FIGS. 11-12, $y_{C,1}$, $y_{C,2}$, $y_{C,3}$ for device C of FIGS. 11-12). For example for device A of FIGS. 11-12: the quantity α of data that is stored by device A: $\alpha = y_{A,1} + y_{A,2} + y_{A,3}$; the code word obtained is $c_{A,1}$, where $c_{A,1} = g_1(x_{A,2}, x_{A,2}, x_{A,3})$, $g_1$ being a linear function; $c_{A,1}$ is of quantity β.

In a step 1702, each of the new/replacing devices, for example devices F', G' of FIGS. 11-12, obtains from each other of the new/replacing devices (for example devices F, G of FIGS. 11-12, F→F' and G-G' being a state transition of device F respectively G) a quantity β' of second redundant data in form of at least one code word (for example 1210 of FIGS. 11-12, where $E_{F,1} = h1(C_{A,1}, C_{B,1}, C_{C,1})$, and for example 1211 of FIGS. 11-12, where $E_{G,1} = h1(C_{A,2}, C_{B,2}, C_{C,2})$), the at least one code word being the result of a computation applied to all of the redundant data retrieved in step 1701 in the form of at least one code word (for example code words $C_{A,1}$ 1222, $C_{B,1}$ 1223, and $C_{C,1}$ 1224 for device F, code words $C_{A,2}$ 1225, $C_{B,2}$ 1226, $C_{C,2}$ 1227 for device G of FIGS. 11-12) and each of the new/replacing devices stores third redundant data of quantity α in form of at least one code word (for example $Y_{F,1}$, $Y_{F,2}$ and $Y_{F,3}$ for device F, $Y_{G,1}$, $Y_{G,2}$, $Y_{G,3}$ for device G of FIGS. 11-12) being the result of a computation applied to all first redundant data retrieved in the step 1701 in form of at least one code word (for example code words $C_{A,1}$ 1222, $C_{B,1}$ 1223, and $C_{C,1}$ 1224 for device F, code words $C_{A,2}$ 1225, $C_{B,2}$ 1226, $C_{C,2}$ 1227 for device G of FIGS. 11-12) and all the second redundancy data in form of at least one code word (for example 1210 where $E_{F,1} = h_1(C_{A,1}, C_{B,1}, C_{C,1})$, and 1211 where $E_{G,1} = h_2(C_{A,2}, C_{B,2}, C_{C,2})$).

The algorithm ends with a step 1703.

Other device architectures than illustrated by FIG. 16 are possible and compatible with the method of the invention. Notably, according to variant embodiments, the invention is implemented as a pure hardware implementation, for example in the form of a dedicated component (for example in an ASIC, FPGA or VLSI, respectively meaning Application Specific Integrated Circuit, Field-Programmable Gate Array and Very Large Scale Integration), or in the form of multiple electronic components integrated in a device or in the form of a mix of hardware and software components, for example a dedicated electronic card in a personal computer.

According to a variant embodiment of the invention, an error resilience management server is used to trigger the adding of redundant data. The error resilience management server then contacts new/replacing devices and provides them with data that is needed to execute the steps of the invention so as to add redundant data to the distributed storage system. According to a variant embodiment of the invention, there is no centralized management server for error resilience management of the distributed data storage system, but rather the error resilience management of the distributed data storage system is decentralized. In such a system, each of the distributed data storage devices monitors itself the amount of redundant data in the distributed data storage system and adds new/replacing devices to the system when for example a predetermined number of monitored neighbor devices have failed.

The method of the invention is used to add redundant data to a distributed storage system. This adding can mean the replacement of lost redundancy, but also the adding of additional redundancy, for example when new measures of the number of observed device failures show that the number of device failures that can be expected is higher than previously estimated.

A device according to the invention can store more than one encoded block of a particular file. A device according to the invention can store more than one encoded blocks and/or can store encoded blocks of more than one file.

According to variant embodiments of the invention, the invention does not use linear codes, but rather uses geometrical codes, or polar codes, which can be useful for obtaining deterministic repairs, i.e. repairs that regenerate exactly what has been lost as it simplifies integrity checks and potentially allows low complexity decoding.

According to a variant embodiment of the invention, the predetermined values d and t are not fixed but vary between subsequent repairs, which allows to adapt the distributed data system to perform in a most efficient manner as possible for each repair. In such case, we use the term adaptive coordinated regenerating codes. Using adaptive coordinated regenerating codes is of interest in highly unpredictable systems such as peer to peer systems where the rate of error can vary, and cannot be predetermined. It is also of interest when the rate of failure, i.e. the number of failures detected simultaneously varies a lot.

The invention claimed is:

1. A method of adding redundant data to a distributed data storage system, wherein said distributed data storage system stores a file of quantity M bits split in k blocks of a first predetermined quantity α bits, comprising devices connected to a network, the method comprising the following successive steps:

adding a first predetermined number t of new devices for adding of redundant data, said first predetermined number being equal to at least two, each of said first predetermined number of new devices contacts a set of any existing devices of a second predetermined number d and obtains, from each of said existing devices of said set, a second predetermined quantity β bits of first redundant data in form of at least one code word being the result of a computation applied to said first predetermined quantity α bits of redundant data stored by each of said existing devices;

obtaining, by each of said new devices, from each other new devices, a third predetermined quantity β' bits of second redundant data in form of at least one code word being the result of a computation applied to all said first redundant data retrieved in the first step in form of at least one code word and stores third redundant data of said first predetermined quantity α bits in form of at least one code word being the result of a computation applied to all said first redundant data retrieved in the first step in form of at least one code word and all said second redundancy data in form of at least one code word;

said second predetermined quantity β bits being different from said third predetermined quantity β' bits, M and k being whole numbers greater than or equal to two, d being superior to k, α being superior or equal to M divided by k, and β and β' being inferior to α.

2. A method according to claim 1, wherein said method minimizes a network data transmission bandwidth γ needed for repair such that $\gamma = d\beta + (t-1)\beta'$.

3. A method according to claim 1, wherein said computations are linear functions.

4. A storage device for a distributed data storage system where data storage devices are connected in a network, said distributed data storage system storing a file of quantity M bits split in k blocks of a first predetermined quantity $\alpha$ bits, said storage device being characterized in that it comprises the following means:
- means to contact a set of any existing devices of a second predetermined number d and to obtain, from each of said existing devices of said set, a second predetermined quantity $\beta$ bits of first redundant data in form of at least one code word being the result of a computation applied to said first predetermined quantity $\alpha$ bits of redundant data stored by each of said existing devices;
- means to obtain, from each other new devices, a third predetermined quantity $\beta'$ bits of second redundant data in form of at least one code word being the result of a computation applied to all said first redundant data retrieved in the first step in form of at least one code word and stores third redundant data of said first predetermined quantity $\alpha$ bits in form of at least one code word being the result of a computation applied to all said first redundant data retrieved in the first step in form of at least one code word and all said second redundancy data in form of at least one code word,
- said second predetermined quantity $\beta$ bits being different from said third predetermined quantity $\beta'$ bits, M and k being whole numbers greater than or equal to two, d being superior to k, $\alpha$ being equal or superior to M divided by k, and $\beta$ and $\beta'$ being inferior to $\alpha$.

\* \* \* \* \*